US006936882B1

(12) United States Patent
Ahmed et al.

(10) Patent No.: US 6,936,882 B1
(45) Date of Patent: Aug. 30, 2005

(54) SELECTIVE SILICIDATION OF GATES IN SEMICONDUCTOR DEVICES TO ACHIEVE MULTIPLE THRESHOLD VOLTAGES

(75) Inventors: Shibly S. Ahmed, San Jose, CA (US); Haihong Wang, Milpitas, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/614,001

(22) Filed: Jul. 8, 2003

(51) Int. Cl.⁷ .................... H01L 29/76; H01L 29/94; H01L 31/062; H01L 31/113; H01L 31/119
(52) U.S. Cl. .................... 257/314; 257/315; 257/316; 257/318; 257/413
(58) Field of Search .................... 257/314–318

(56) References Cited

U.S. PATENT DOCUMENTS

| | | | | |
|---|---|---|---|---|
| 4,319,395 A | * | 3/1982 | Lund et al. .................. | 438/232 |
| 4,399,605 A | * | 8/1983 | Dash et al. .................. | 438/154 |
| 6,391,750 B1 | * | 5/2002 | Chen et al. .................. | 438/583 |
| 6,451,693 B1 | * | 9/2002 | Woo et al. .................. | 438/682 |
| 6,589,836 B1 | * | 7/2003 | Wang et al. .................. | 438/231 |
| 6,657,259 B2 | * | 12/2003 | Fried et al. .................. | 257/350 |
| 6,800,905 B2 | | 10/2004 | Fried et al. | |
| 6,846,734 B2 | * | 1/2005 | Amos et al. .................. | 438/592 |
| 2001/0045589 A1 | * | 11/2001 | Takeda et al. .............. | 257/297 |
| 2002/0088971 A1 | * | 7/2002 | Tezuka et al. ................ | 257/19 |
| 2004/0038464 A1 | * | 2/2004 | Fried et al. .................. | 438/151 |
| 2004/0048424 A1 | * | 3/2004 | Wu et al. .................... | 438/154 |
| 2004/0195628 A1 | * | 10/2004 | Wu et al. .................... | 257/351 |

OTHER PUBLICATIONS

Digh Hisamoto et al., "FinFET—A Self-Aligned Double-Gate MOSFET Scalable to 20 nm," IEEE Transactions on Electron Devices, vol. 47, No. 12, Dec. 2000, pp. 2320-2325.
Yang-Kyu Choi et al., "Sub-20nm CMOS FinFET Technologies," 2001 IEEE, IEDM, pp. 421-424.
Xuejue Huang et al., "Sub-50 nm P-Channel FinFET," IEEE Transactions on Electron Devices, vol. 48, No. 5, May 2001, pp. 880-886.
Xuejue Huang et al., "Sub 50-nm FinFET: PMOS," 1999 IEEE, IEDM, pp. 67-70.

(Continued)

Primary Examiner—Jerome Jackson
Assistant Examiner—Jesse A. Fenty
(74) Attorney, Agent, or Firm—Harrity & Snyder, LLP (57) ABSTRACT

A semiconductor device includes a substrate and an insulating layer formed on the substrate. A first device may be formed on the insulating layer. The first device may include a first fin formed on the insulating layer, a first dielectric layer formed on the first fin, and a partially silicided gate formed over a portion of the first fin and the first dielectric layer. A second device also may be formed on the insulating layer. The second device may include a second fin formed on the insulating layer, a second dielectric layer formed on the second fin, and a fully silicided gate formed over a portion of the second fin and the second dielectric layer.

16 Claims, 8 Drawing Sheets

OTHER PUBLICATIONS

Yang-Kyu Choi et al., "Nanoscale CMOS Spacer FinFET for the Terabit Era," IEEE Electron Device Letters, vol. 23, No. 1, Jan. 2002, pp. 25-27.

Co-pending U.S. Appl. No. 10/674,520 filed Oct. 2, 2003 entitled: "Damascene FinFET Gate With Selective Metal Interdiffusion," 16 page specification, 19 sheets of drawings.

Copy of co-pending U.S. Appl. No. 10/857,931 filed Jun. 2, 2004, titled: "Selective Channel Implantation for Forming Semiconductor Devices with Different Threshold Values," Haihong Wang et al., 21page specification, 20 sheets of drawings.

* cited by examiner

SELECTIVE SILICIDATION OF GATES IN SEMICONDUCTOR DEVICES TO ACHIEVE MULTIPLE THRESHOLD VOLTAGES

TECHNICAL FIELD

The present invention relates to semiconductor devices and methods of manufacturing semiconductor devices. The present invention has particular applicability to double-gate devices.

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In several respects, the double-gate MOSFETs offer better characteristics than the conventional bulk silicon MOSFETs. These improvements arise because the double-gate MOSFET has a gate electrode on both sides of the channel, rather than on only one side as in conventional MOSFETs. When there are two gates, the electric field generated by the drain is better screened from the source end of the channel. Also, two gates can control roughly twice as much current as a single gate, resulting in a stronger switching signal.

A FinFET is a recent double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention may provide a first FinFET device with a gate that is silicided a first amount and a second FinFET device with a gate that is silicided a second amount.

Additional advantages and other features of the invention will be set forth in part in the description which follows and in part will become apparent to those having ordinary skill in the art upon examination of the following or may be learned from practice of the invention. The advantages and features of the invention may be realized and obtained as particularly pointed out in the appended claims.

According to the present invention, the foregoing and other advantages are achieved in part by a semiconductor device that includes a substrate and an insulating layer formed on the substrate. A first device may be formed on the insulating layer. The first device may include a first fin formed on the insulating layer and a first silicided gate formed over a portion of the first fin. The first silicided gate may include a first thickness of silicide material. A second device also may be formed on the insulating layer. The second device may include a second fin formed on the insulating layer and a second silicided gate formed over a portion of the second fin. The second silicided gate may include a second thickness of silicide material that is different from the first thickness.

According to another aspect of the invention, a method of manufacturing a semiconductor device may include forming first and second fin structures on an insulator and forming first and second gates over respective channel portions of the first and second fin structures. The method may also include partially siliciding the first and second gates and fully siliciding one of the first and second gates.

According to a further aspect of the invention, a semiconductor device may include a substrate and an insulating layer formed on the substrate. A first device may be formed on the insulating layer. The first device may include a first fin formed on the insulating layer, a first dielectric layer formed on the first fin, and a partially silicided gate formed over a portion of the first fin and the first dielectric layer. A second device also may be formed on the insulating layer. The second device may include a second fin formed on the insulating layer, a second dielectric layer formed on the second fin, and a fully silicided gate formed over a portion of the second fin and the second dielectric layer.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, where elements having the same reference number designation may represent like elements throughout.

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the present invention provide a first FinFET device with a gate that is silicided a first amount and a second FinFET device with a gate that is silicided a second amount. In one implementation, the second amount may be full silicidation of the gate. The different gate silicidation of the first and second devices may produce different threshold voltages for the devices.

Figure 1:
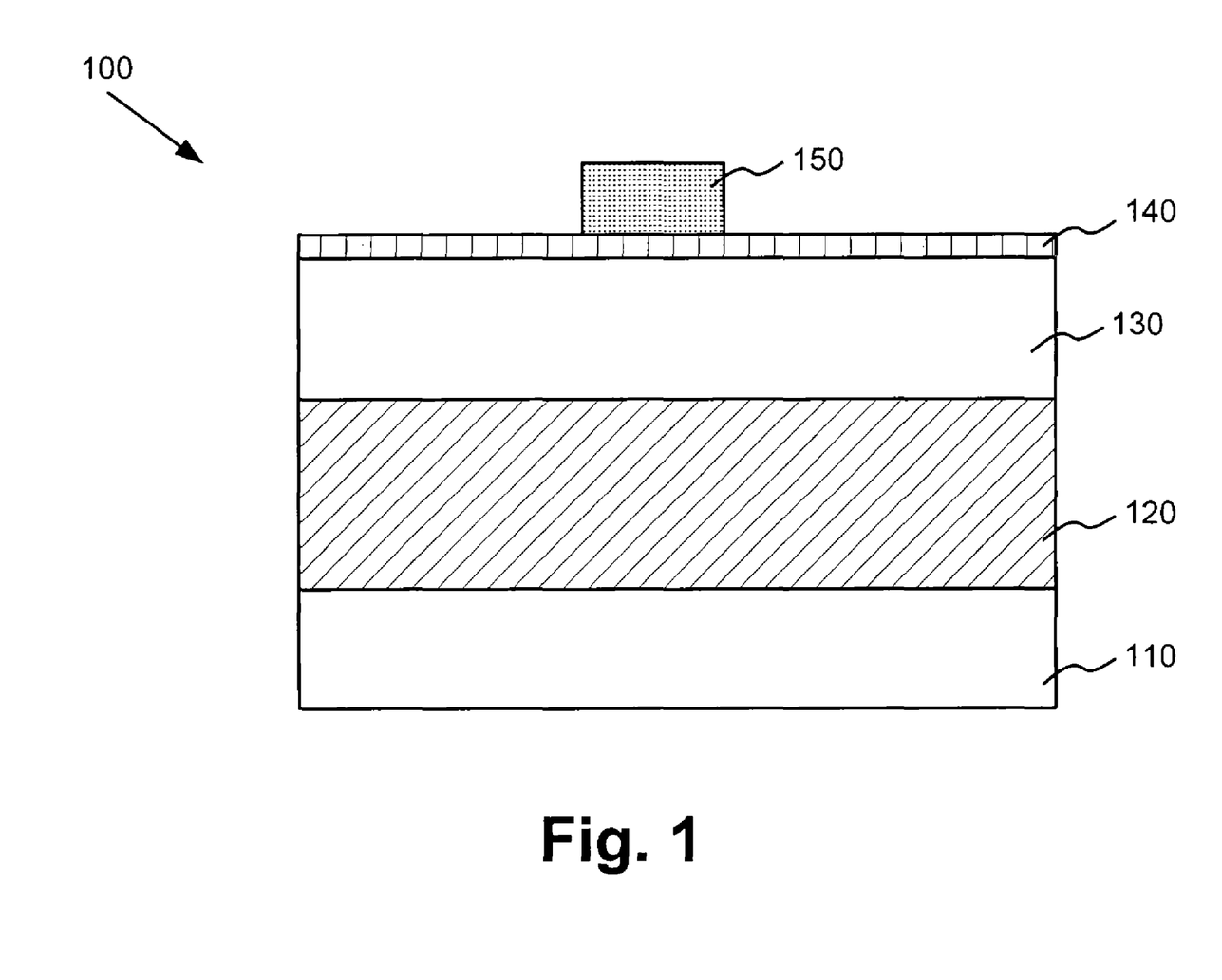
FIG. 1 is a cross-section illustrating exemplary layers that may be used for forming a fin in accordance with an embodiment of the present invention.

FIG. 1 illustrates the cross-section of a semiconductor device 100 formed in accordance with an embodiment of the present invention. Although FIG. 1 and subsequent figures illustrate a single device 100, those skilled in the semiconductor arts will understand that other devices (e.g., semiconductor devices 100', 100", etc. (see FIG. 8)) may be formed on the same wafer (or portion of a wafer, chip, etc.) in parallel with semiconductor device 100 using the process described herein. Referring to FIG. 1, semiconductor device 100 may include a silicon on insulator (SOI) structure that includes a silicon substrate 110, a buried oxide layer 120 and a silicon layer 130 formed on the buried oxide layer 120. Buried oxide layer 120 and silicon layer 130 may be formed on substrate 110 in a conventional manner.

In an exemplary implementation, buried oxide layer 120 may include a silicon oxide and may have a thickness ranging from about 1000 Å to about 3000 Å. Silicon layer 130 may include monocrystalline or polycrystalline silicon having a thickness ranging from about 300 Å to about 1500 Å. Silicon layer 130 is used to form a fin structure for a double-gate transistor device, as described in more detail below.

In alternative implementations consistent with the present invention, substrate 110 and layer 130 may include other semiconducting materials, such as germanium, or combinations of semiconducting materials, such as silicon-germanium. Buried oxide layer 120 may also include other dielectric materials.

A top dielectric layer 140, such as a silicon nitride layer or a silicon oxide layer (e.g., SiO$_2$), may be formed over silicon layer 130 to act as a protective cap during subsequent etching processes. In an exemplary implementation, dielectric layer 140 may be formed to a thickness ranging from about 150 Å to about 700 Å. Next, a photoresist material may be deposited and patterned to form a photoresist mask 150 for subsequent processing. The photoresist material may be deposited and patterned in any conventional manner.

Semiconductor device 100 may then be etched. In an exemplary implementation, dielectric layer 140 and silicon layer 130 may be etched in a conventional manner, with the etching terminating on buried oxide layer 120 to form a fin. Photoresist mask 150 may then be removed. After the formation of the fin, source and drain regions may be formed (e.g., by deposition or epitaxial growth of a semiconducting material) adjacent the respective ends of the fin. For example, in an exemplary embodiment, a layer of silicon, germanium or combination of silicon and germanium may be deposited, patterned and etched in a conventional manner to form source and drain regions. Alternately, the source and drain regions may be formed in the same photolithography process that forms the fin.

Figure 2A:
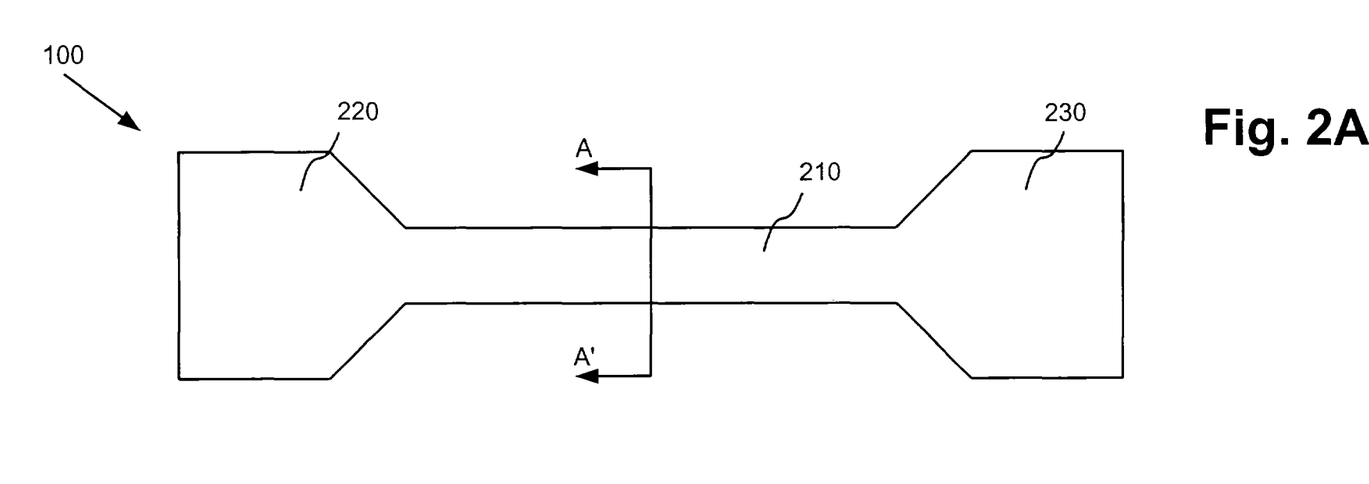
FIG. 2A schematically illustrates the top view of a fin structure in accordance with an exemplary embodiment of the present invention.

FIG. 2A schematically illustrates the top view of a fin structure on semiconductor 100 formed in such a manner. Source region 220 and drain region 230 may be formed adjacent the ends of structure 210 on buried oxide layer 120, according to an exemplary embodiment of the present invention.

Figure 2B:
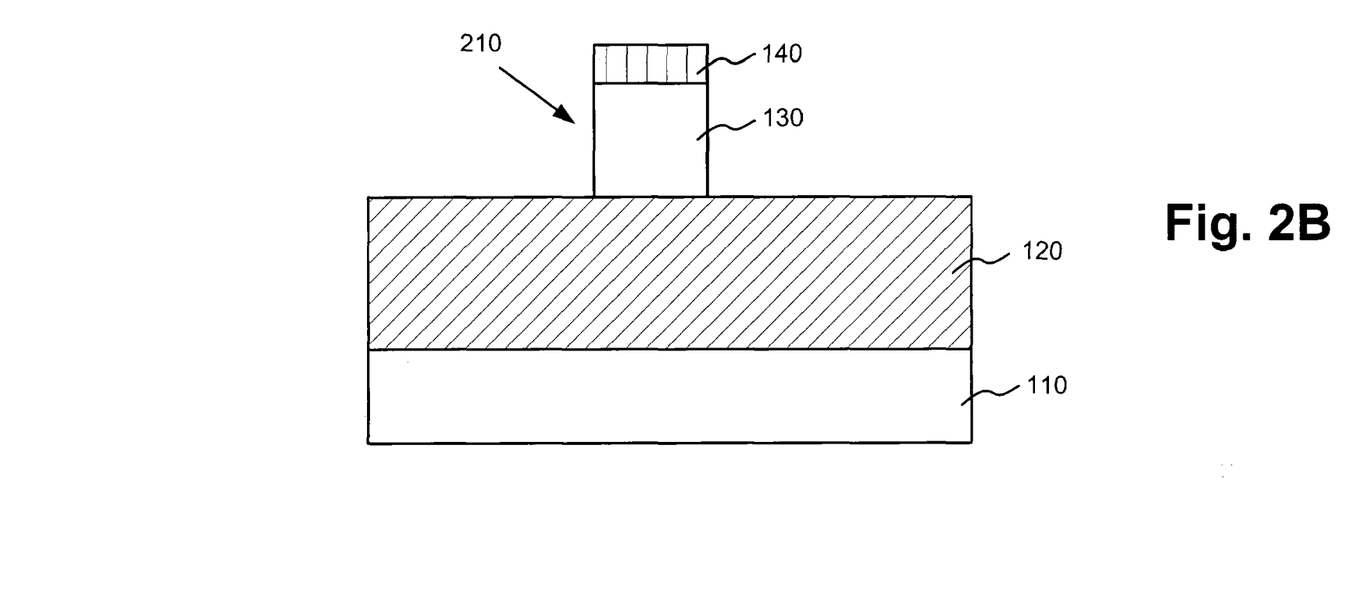
FIG. 2B is a cross-section illustrating the formation of the fin structure of FIG. 2A in accordance with an exemplary embodiment of the present invention.

FIG. 2B is a cross-section along line A-A' in FIG. 2A illustrating the formation of fin structure 210 in accordance with an exemplary embodiment of the present invention. As described above, dielectric layer 140 and silicon layer 130 may be etched to form structure 210. Structure 210 may include a silicon fin 130 and a dielectric cap 140. In an exemplary implementation, the width of silicon fin 130 may range from about 10 Å to about 100 Å.

Figure 3:
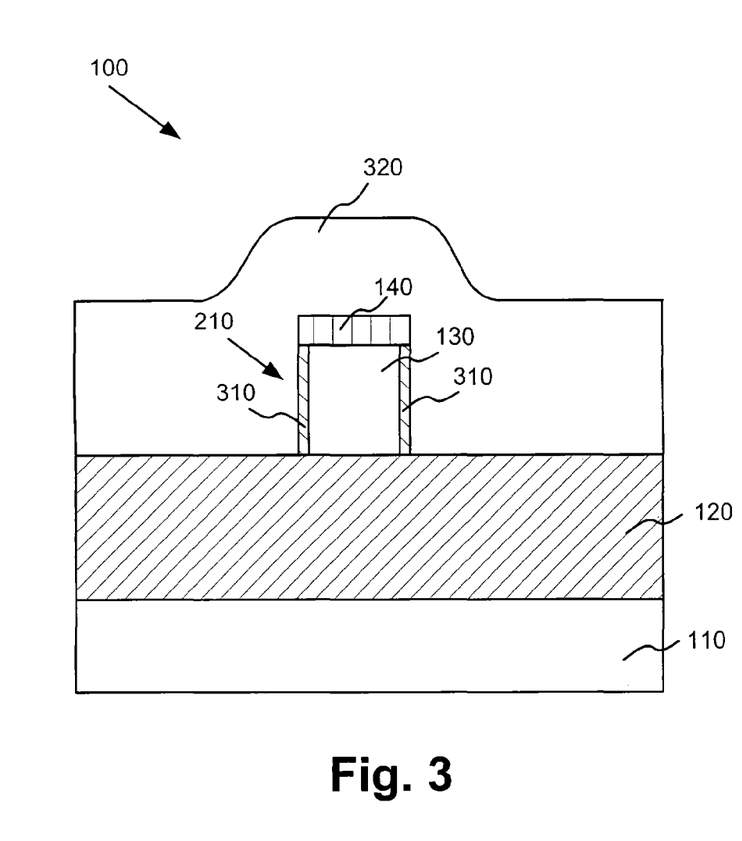
FIG. 3 is a cross-section illustrating the formation of a gate oxide and gate material on the device of FIG. 2B in accordance with an exemplary embodiment of the present invention.

FIG. 3 is a cross-section illustrating the formation of a gate oxide and gate material on structure 210 in accordance with an exemplary embodiment of the present invention. A relatively thin gate oxide may be formed on exposed side surfaces of fin 130 as illustrated in FIG. 3. For example, a gate oxide 310 may be thermally grown on fin 130. Gate oxide 310 may be grown to a thickness of about 50 Å to about 150 Å and may be formed on the side surfaces of fin 130.

A gate material layer 320 may be deposited over semiconductor device 100 after formation of gate oxide 310. In an exemplary implementation, gate material layer 320 may include polysilicon deposited using conventional chemical vapor deposition (CVD) or other well known techniques. Alternatively, other semiconducting materials, such as germanium or combinations of silicon and germanium, or various metals may be used as the gate material in layer 320.

Figure 4:
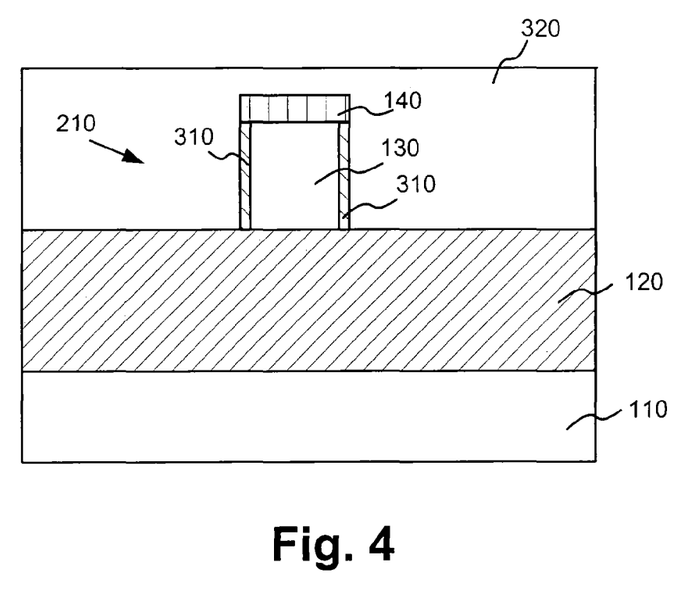
FIG. 4 is a cross-section illustrating the planarizing of the gate material of FIG. 3 in accordance with an exemplary embodiment of the present invention.

FIG. 4 is a cross-section illustrating the planarizing of gate material 320 in accordance with an exemplary embodiment of the present invention. Planarizing gate material 320 may remove any non-planar protrusions in the material, such as that shown above the fin structure 210 in FIG. 3. Returning to FIG. 4, chemical-mechanical polishing (CMP) or other conventional techniques may be performed so that the upper surface of gate material 320 is substantially planar. Planar gate material 320 may extend about 200 Å to about 700 Å above dielectric cap 140. A thickness of gate material 320 in the areas adjacent fin structure 210 after planarizing may range from about 700 Å to about 2000 Å.

Figure 5A:
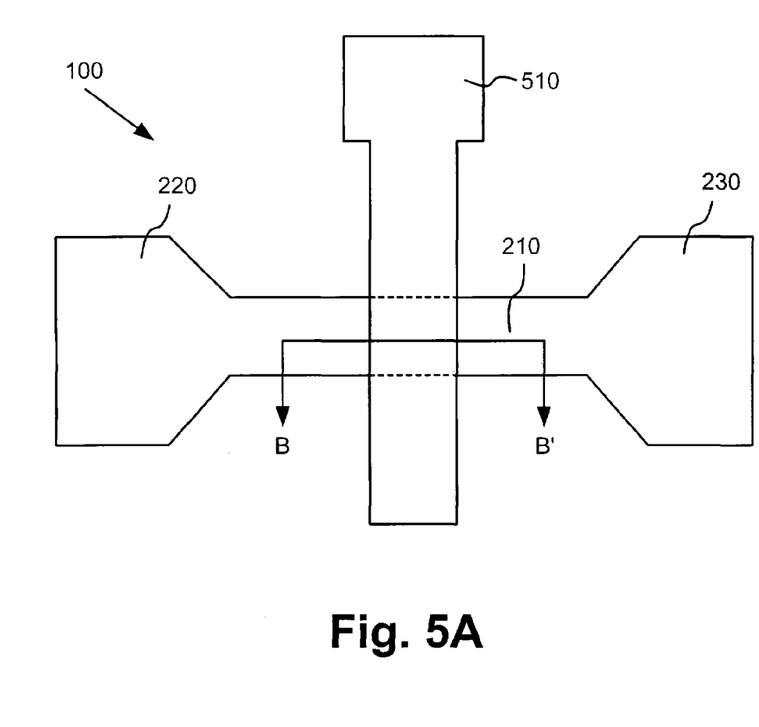
FIG. 5A schematically illustrates a top view of a FinFET structure in accordance with an exemplary embodiment of the present invention.

FIG. 5A schematically illustrates the top view of semiconductor device 100 at one stage in processing in accordance with an exemplary embodiment of the present invention. As illustrated, a gate may be patterned and etched in gate material 320 to form gate structure 510 that extends across a channel region of the fin structure 210.

Figure 5B:
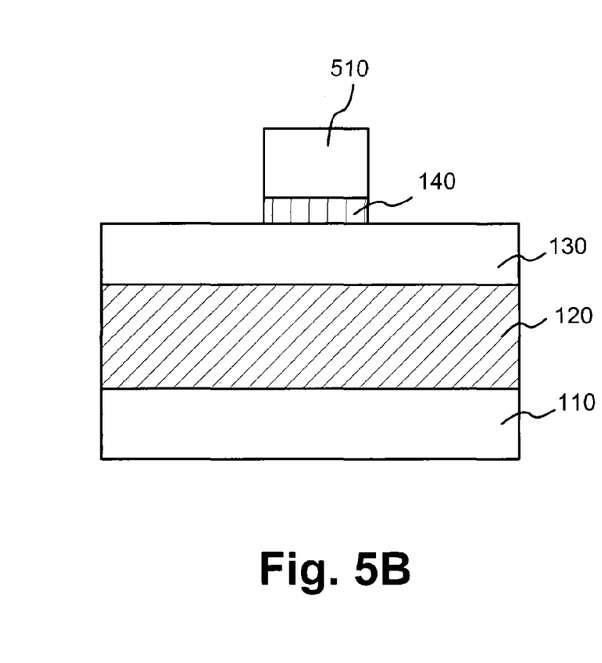
FIG. 5B is a cross-section illustrating the formation of the FinFET structure of FIG. 5A in accordance with an exemplary embodiment of the present invention.

FIG. 5B is a cross-section taken along line B-B' in FIG. 5A and illustrates the formation of semiconductor device 100 of FIG. 5A in accordance with an exemplary embodiment of the present invention. Gate structure 510 may be defined in gate material layer 320 by lithography (e.g., photolithography). A bottom antireflective coating (BARC) layer (not shown) may be deposited on planar gate material layer 320 to facilitate etching of gate material layer 320. As will be understood by those skilled in the semiconductor art, photoresist (and possibly a top antireflective (TAR) coating) may be deposited on the BARC layer and patterned in the shape of gate structure 510.

Gate material layer 320 (e.g., polysilicon) may then be selectively etched to form gate structure 510 out of gate material layer 320 on device 100. Planar gate material layer 320 may provide at least a planar bottom surface for the BARC layer (not shown), and may tend to flatten the top surface of the BARC layer. The BARC layer may have a thickness ranging from about 100 Å to about 500 Å. Because of planar gate material layer 320, the photoresist over the BARC layer may be patterned more precisely. As a result, the gate structure 510's critical dimension (CD) (i.e., its smallest feature size, such as the gate width) may be formed with dimensions as small as from about 20 nm to about 50 nm.

Gate structure 510 may include a gate portion proximate to the sides of the fin structure 210 and a larger electrode portion spaced apart from the fin structure 210. The electrode portion of gate structure 510 may provide an accessible electrical contact for biasing or otherwise controlling the gate portion.

As may be seen in FIG. 5B, portions of dielectric cap 140 located outside the perimeter of gate structure 510 may be removed. In other words, the selective etching of gate material layer 320 may remove all material beyond gate structure 510, down to fin 130 of fin structure 210. Further, it should be noted that gate oxide 310 still may be present on fin 130, but is not illustrated in FIG. 5B because the line B-B' in FIG. 5A extends along fin 130 of fin structure 210.

The source/drain regions 220 and 230 may then be doped. For example, n-type or p-type impurities may be implanted in source/drain regions 220 and 230. The particular implantation dosages and energies may be selected based on the particular end device requirements. One of ordinary skill in this art would be able to optimize the source/drain implantation process based on the circuit requirements and such acts are not disclosed herein in order not to unduly obscure the thrust of the present invention. Activation annealing may then be performed to activate the source/drain regions 220 and 230.

Figure 6:
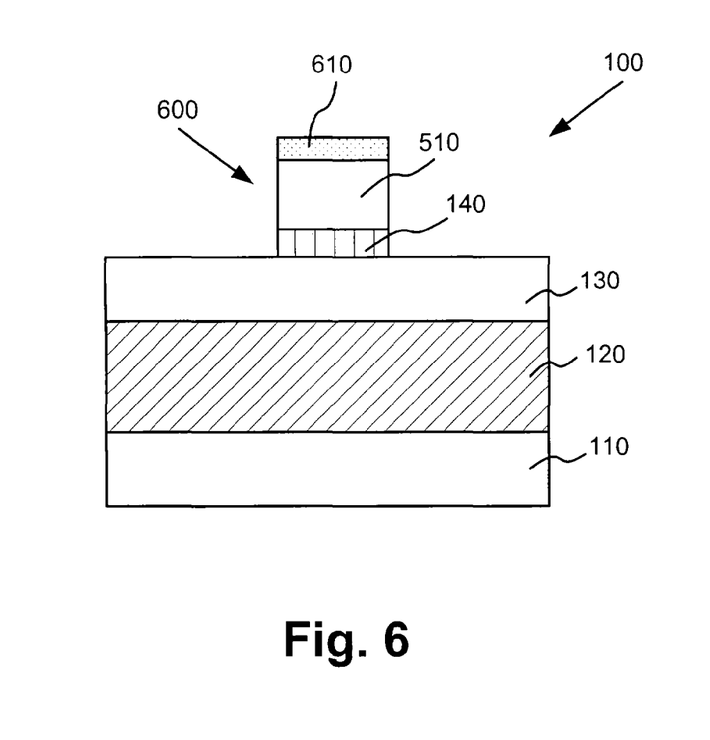
FIG. 6 is a cross-section illustrating a further stage in the formation of the FinFET structure in accordance with an exemplary embodiment of the present invention.

FIG. 6 is a cross-section along the line B-B' in FIG. 5A illustrating a further stage in the formation of semiconductor device 100 in accordance with an exemplary embodiment of the present invention. Gate 510 may be "partially silicided" (i.e., silicided down to some thickness less than the full thickness of gate 510) to form partially silicided gate 600.

For such siliciding, a metal (e.g., nickel or cobalt) may be deposited over polysilicon gate 510. The metal may then be annealed to form silicided gate portion 610 (e.g., NiSi or CoSi$_2$) on polysilicon gate region 510 as illustrated in FIG. 6. In an exemplary implementation, the thickness of the silicided gate portion 610 may range from about 100 Å to about 1000 Å.

As noted above, other semiconductor devices may be formed on the same wafer (or portion of a wafer, chip, etc.) in parallel with semiconductor device 100 using the process described herein. In one implementation consistent with the principles of the invention, certain semiconductor devices may be covered by a mask, and further processing may be performed on those devices left uncovered by the mask. For example, some devices (e.g., device 100 in FIG. 6) may be covered with photoresist (or some other masking material) that is selectively removed to form a mask over these devices.

Figure 7:
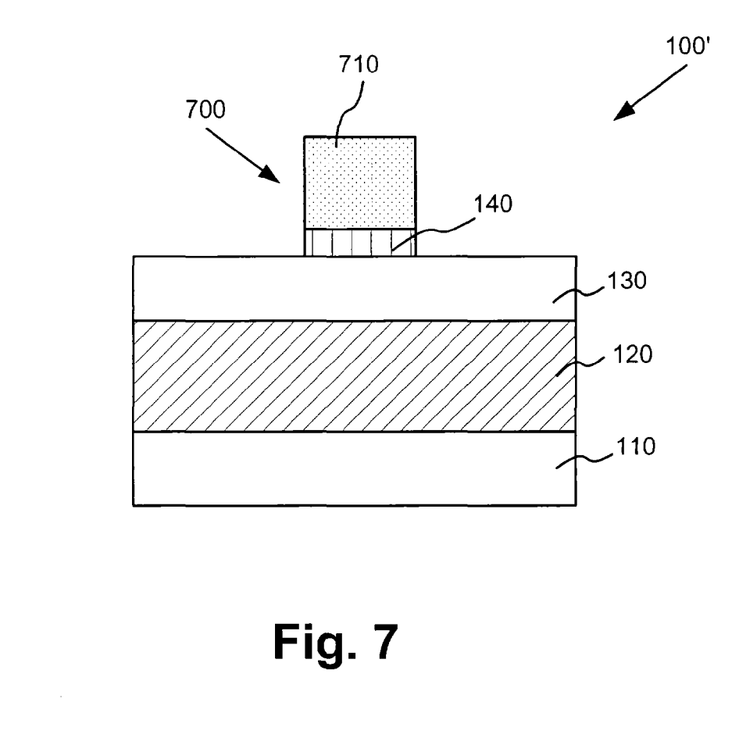
FIG. 7 is a cross-section illustrating a further stage in the formation of some FinFET devices in accordance with an exemplary embodiment of the present invention.

FIG. 7 is a cross-section illustrating a semiconductor device 100' that is left uncovered by such a mask. Semiconductor device 100' may initially have a partially silicided gate, like gate 600 of device 100 in FIG. 6. This gate may then be "fully silicided" (i.e., silicided down to dielectric cap 140) to form a fully silicided gate 700.

For such siliciding, a metal (e.g., nickel or cobalt) again may be deposited over the partially silicided gate. The metal may then be annealed to silicide any remaining polysilicon in gate 700 and form silicide material 710 (e.g., NiSi or CoSi$_2$) on dielectric cap 140 as illustrated in FIG. 7. In an exemplary implementation, the thickness of fully silicided gate 700 may range from 400 Å to about 1000 Å. After the full siliciding, the mask may be removed from the other semiconductor devices (e.g., device 100 in FIG. 6), and any further, typical processing may be performed on devices 100 and 100'.

Because of fully silicided gate 700, device 100' in FIG. 7 may have a different threshold voltage (Vt) than a similar device with a partially silicided gate (e.g., device 100 with gate 600 illustrated in FIG. 6). In one implementation consistent with the principles of the invention, fully silicided gate 700 may change the threshold voltage Vt of device 100' in FIG. 7 by about 200 mV to about 400 mV, relative to a device with a partially silicided gate (e.g., gate 600).

Figure 8:
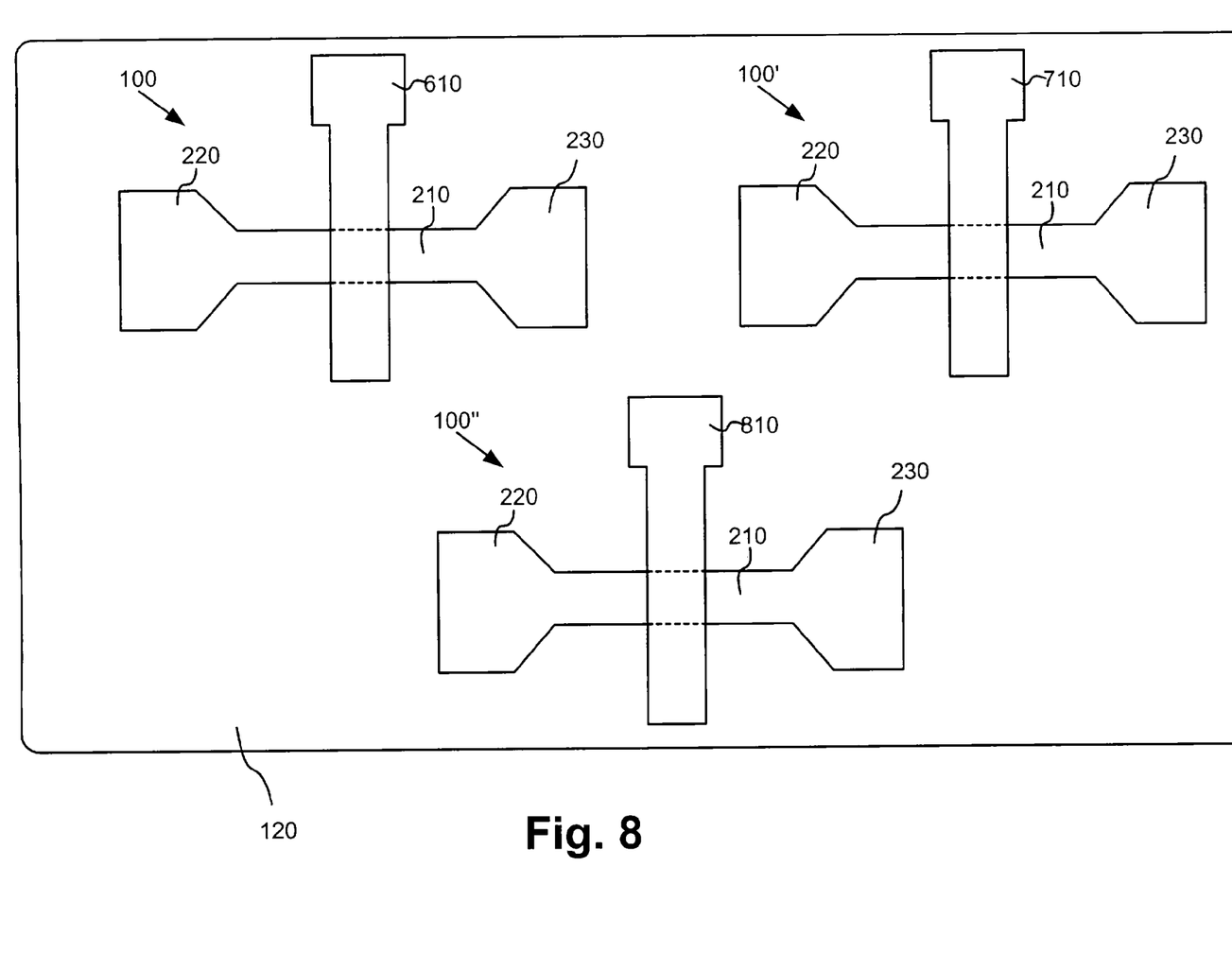
FIG. 8 schematically illustrates a top view of a wafer including the devices of FIGS. 6 and 7 in accordance with an exemplary embodiment of the present invention.

FIG. 8 schematically illustrates a top view of a wafer including device 100 (FIG. 6) and device 100' (FIG. 7) in accordance with an exemplary embodiment of the present invention. Buried oxide layer 120 illustrates the wafer (or chip), on which the three illustrated devices 100, 100' and 100" are formed. Device 100 may have a partially silicided gate that is shown from above as silicided gate portion 610. Device 100' may have a fully silicided gate that is shown from above as silicide material 710. A third device 100" may have a gate 810 that is not silicided (e.g., as gate 510 in FIG. 5). Alternately, gate 810 may be partially silicided to a greater or lesser thickness than silicided gate portion 610 in device 100. Although devices 100, 100' and 100" may be connected to other devices, or interconnected, these connections are not illustrated in FIG. 8 for clarity of presentation.

Those skilled in the art will understand, in view of the disclosure herein, that different devices (e.g., devices 100 and 100') may be formed with different Vt's for a variety of design reasons. For example, the threshold voltage Vt may be varied based on the type of device 100/100'. In one implementation consistent with the principles of the invention, N-type MOS (NMOS) devices may be formed with a Vt larger in magnitude (i.e., absolute value) than the Vt of P-type MOS (PMOS) devices on the same wafer/chip. Alternately, PMOS devices may be formed with a Vt larger in magnitude than the Vt of NMOS devices on the same wafer/chip.

It may also be advantageous to vary Vt within a given circuit element (e.g., inverter, NAND gate, memory element, NOR gate, etc.). Within a single circuit element, for example, one FinFET device 100 may have a partially silicided gate 600 to achieve a first threshold voltage Vt$_1$. Another FinFET device 100' within the circuit element may have fully silicided gate 700 and a second, different threshold voltage Vt$_2$. In some implementations consistent with the principles of the invention, the fins of devices 100 and 100' in the circuit element may be electrically connected (e.g., by connecting region 230 in device 100 with region 220 in device 100' in FIG. 8).

Alternately, or additionally, Vt may be varied between circuit elements. For example, one circuit element may include one or more FinFET devices 100 having partially silicided gates 600 and associated first threshold voltages Vt$_1$. A separate circuit element may include one or more FinFET devices 100' having fully silicided gates 700 and associated second, different threshold voltages Vt$_2$.

Thus, in accordance with the present invention, different FinFET devices 100/100' may be formed with differentially silicided gates 600/700. These different devices 100/100' may be formed on the same wafer or chip and may exhibit different threshold voltages Vt. Advantageously, the resulting structure exhibits good short channel behavior. In addition, the present invention provides increased flexibility and can be easily integrated into conventional processing.

Other Implementation

Figure 9A:
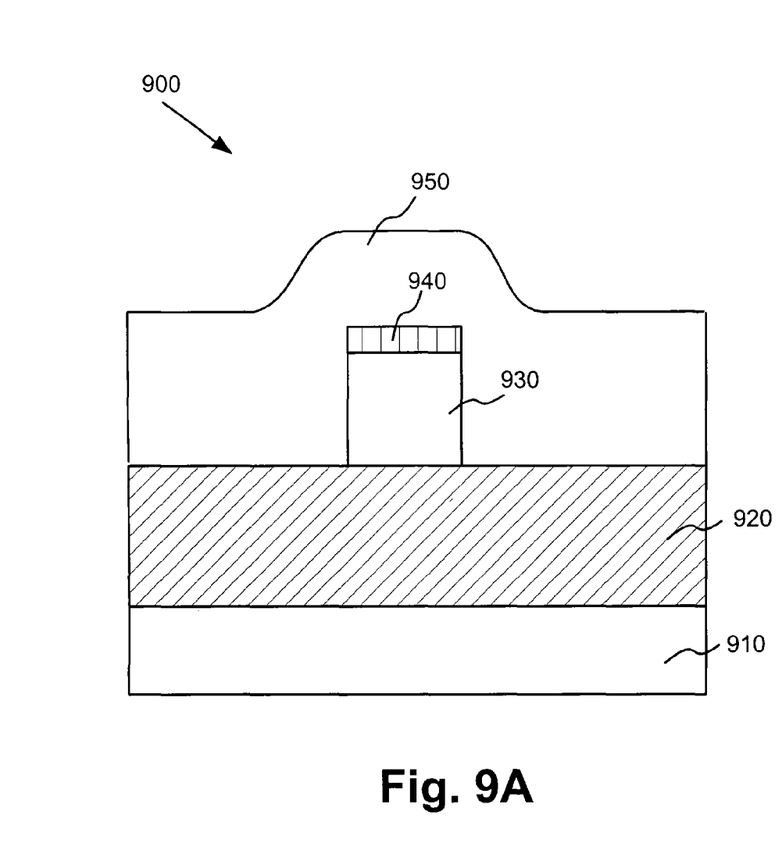
FIGS. 9A to 9D are cross-sections illustrating the formation of a structure with a controlled thickness in a semiconductor device in accordance with another implementation of the present invention.

In some implementations, it may be desirable to form a structure with a controlled thickness. FIGS. 9A–9D are cross-sections illustrating the formation of a structure with a controlled thickness in a semiconductor device in accordance with another implementation of the present invention. FIG. 9A is a cross-section illustrating a FinFET 900 after fin formation (similar to FIG. 3). A silicon fin 930 may be formed on an insulator 920 and a substrate 910. Before fin 930 is formed a thin polish stop layer (PSL) may be deposited, resulting in a PSL cap 940 after fin formation. A polysilicon layer 950 may be deposited over the PSL cap 940 and fin 930 as shown in FIG. 9A.

Figure 9B:
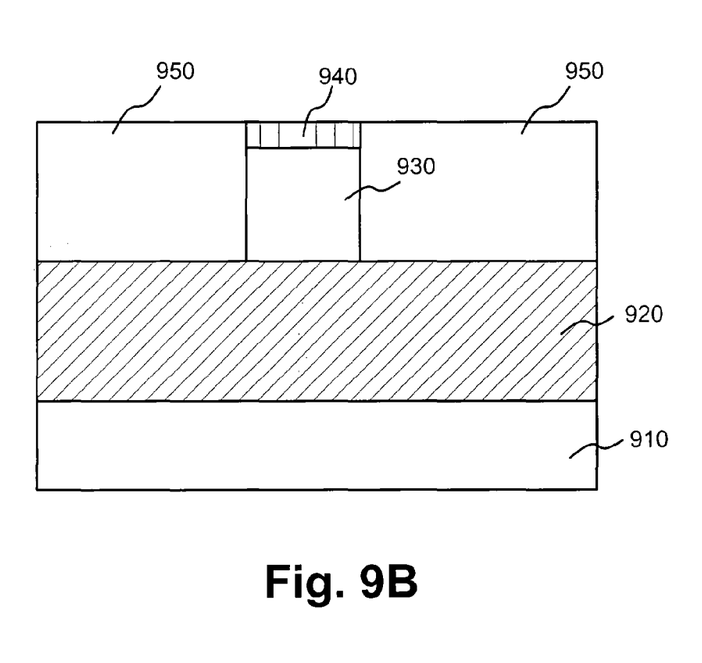
Figure 9C:
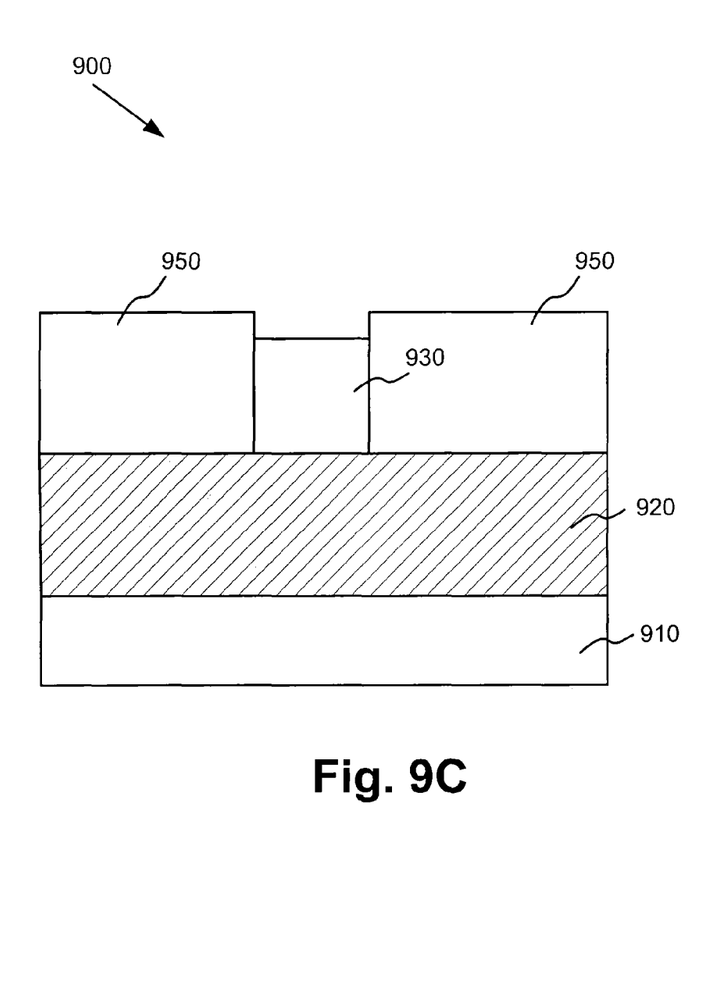

Polysilicon layer 950 may be chemical-mechanical polished (CMP) until PSL cap 940 is reached (FIG. 9B). As this point, PSL cap 940 may produce materials that may be detected to stop the CMP. Use of PSL cap 940 may facilitate achieving a desired thickness of polysilicon layer 950 (e.g., 200 Å). The resulting polysilicon regions 950, however, are electrically disconnected. As illustrated in FIG. 9C, PSL cap 940 may then be removed, such as by selective etching.

Figure 9D:
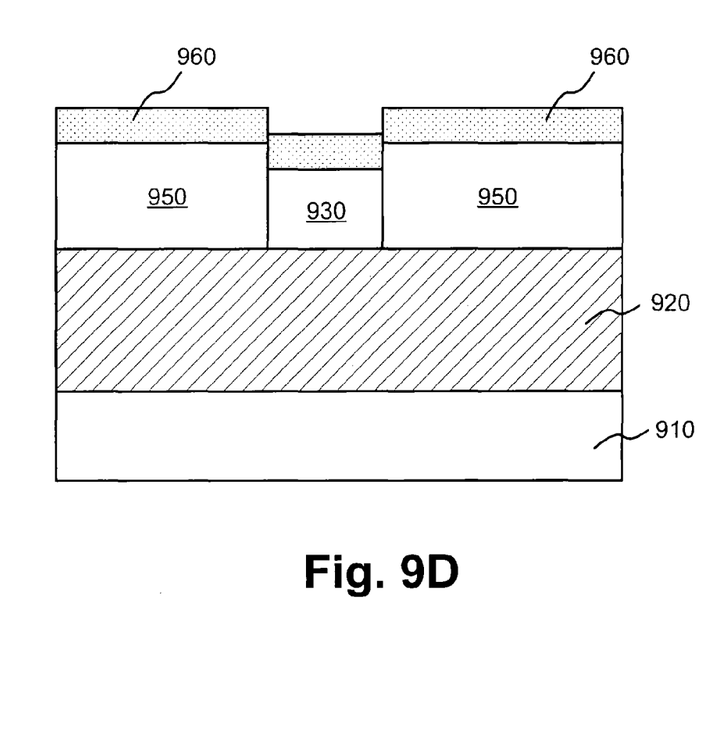

Impurities may them be implanted into the structure of FIG. 9C, resulting in an implanted silicon layer 960 illustrated in FIG. 9D. Implanted silicon layer 960 may electrically connect polysilicon regions 950 on either side of fin 930. In this manner, polysilicon layer 950 may be formed with a thickness controlled by the height of fin 930. Polysilicon regions 950 on either side of fin 930 may be re-connected using silicon implantation.

In the previous descriptions, numerous specific details are set forth, such as specific materials, structures, chemicals, processes, etc., in order to provide a thorough understanding of the present invention. However, the present invention can be practiced without resorting to the specific details set forth herein. In other instances, well known processing structures have not been described in detail, in order not to unnecessarily obscure the thrust of the present invention.

The dielectric and conductive layers used in manufacturing a semiconductor device in accordance with the present invention can be deposited by conventional deposition techniques. For example, metallization techniques, such as various types of CVD processes, including low pressure CVD (LPCVD) and enhanced CVD (ECVD) can be employed.

The present invention is applicable to the formation of any of various types of semiconductor devices, and hence, details have not been set forth in order to avoid obscuring the thrust of the present invention. In practicing the present invention, conventional photolithographic and etching techniques are employed and, hence, the details of such techniques have not been set forth herein in detail.

Only the preferred embodiments of the invention and a few examples of its versatility are shown and described in the present disclosure. It is to be understood that the invention is capable of use in various other combinations and environments and is capable of modifications within the scope of the inventive concept as expressed herein.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the claims and their equivalents.

What is claimed is:

1. A semiconductor device, comprising:
   a substrate;
   an insulating layer formed on the substrate;
   a first device formed on the insulating layer, including:
      a first fin formed on the insulating layer, and
      a first silicided gate formed over a portion of the first fin and including a first thickness of silicide material; and
   a second device formed on the insulating layer, including:
      a second fin formed on the insulating layer, and a second silicided gate formed over a portion of the second fin and including a second thickness of silicide material different from the first thickness, wherein
   a threshold voltage of the second device varies about 200 millivolts to about 400 millivolts from a threshold voltage of the first device.

2. The semiconductor device of claim 1, wherein the first device further includes:
   a first dielectric layer formed between the first fin and the first silicided gate, and
   wherein the second device further includes:
   a second dielectric layer formed between the second fin and the second silicided gate.

3. The semiconductor device of claim 1, wherein the first silicided gate is partially silicided and the first thickness ranges from about 100 Å to about 500 Å.

4. The semiconductor device of claim 1, wherein the second silicided gate is fully silicided.

5. The semiconductor device of claim 4, wherein the second thickness ranges from about 400 Å to about 1000 Å.

6. The semiconductor device of claim 1, wherein the first device is an NMOS device and the second device is a PMOS device.

7. The semiconductor device of claim 1, wherein the first device and the second device are included in a single circuit element.

8. The semiconductor device of claim 1, wherein:
   a width of the first fin and the second fin ranges from about 10 Å to about 100 Å.

9. A semiconductor device, comprising:
   a substrate;
   an insulating layer formed on the substrate;
   a first device formed on the insulating layer, including:
      a first fin formed on the insulating layer,
      a first dielectric layer formed on the first fin, and
      a partially silicided gate formed over a portion of the first fin and the first dielectric layer; and
   a second device formed on the insulating layer, including:
      a second fin formed on the insulating layer,
      a second dielectric layer formed on the second fin, and
      a fully silicided gate formed over a portion of the second fin and the second dielectric layer, wherein
   a threshold voltage of the second device varies about 200 millivolts to about 400 millivolts from a threshold voltage of the first device.

10. The semiconductor device of claim 9, wherein a silicided portion of the partially silicided gate has a thickness ranging from about 100 Å to about 500 Å.

11. The semiconductor device of claim 9, wherein the fully silicided gate has a thickness ranging from about 400 Å to about 1000 Å.

12. The semiconductor device of claim 9, wherein one of the first device and the second device is an NMOS device and another one of the first device and the second device is a PMOS device.

13. The semiconductor device of claim 9, wherein the first fin and the second fin are electrically connected.

14. The semiconductor device of claim 13, wherein a drain region of the first fin is electrically connected to a source region of the second fin.

15. The semiconductor device of claim 9, further comprising:

a third device formed on the insulating layer, including:
  a third fin formed on the insulating layer,
  a third dielectric layer formed on the third fin, and
  a partially silicided gate formed over a portion of the third fin and the third dielectric layer, wherein
a silicided portion of the partially silicided gate formed over the portion of the third fin and the third dielectric layer has a different thickness than a silicided portion of the partially silicided gate formed over the portion of the first fin and the first dielectric layer.

16. The semiconductor device of claim 9, wherein:

a width of the first fin and the second fin ranges from about 10 Å to about 100 Å.

* * * * *